United States Patent
Lovenich et al.

(10) Patent No.: US 10,138,382 B2
(45) Date of Patent: Nov. 27, 2018

(54) FORMULATIONS COMPRISING METAL NANOWIRES AND PEDOT

(71) Applicant: Heraeus Deutschland GmbH & Co. KG, Hanau (DE)

(72) Inventors: Wilfried Lovenich, Bergisch-Gladbach (DE); Rüdiger Sauer, Leverkusen (DE); Andreas Elschner, Mülheim (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 36 days.

(21) Appl. No.: 15/321,304

(22) PCT Filed: Jul. 24, 2015

(86) PCT No.: PCT/EP2015/067066
§ 371 (c)(1),
(2) Date: Dec. 22, 2016

(87) PCT Pub. No.: WO2016/012616
PCT Pub. Date: Jan. 28, 2016

(65) Prior Publication Data
US 2017/0198155 A1  Jul. 13, 2017

(30) Foreign Application Priority Data

Jul. 25, 2014 (EP) .................................... 14002584

(51) Int. Cl.
| | | |
|---|---|---|
| C09D 5/24 | (2006.01) |
| C09D 7/40 | (2018.01) |
| H01B 1/22 | (2006.01) |
| C09D 165/00 | (2006.01) |
| H01B 1/12 | (2006.01) |
| H01L 51/00 | (2006.01) |
| C08K 7/24 | (2006.01) |
| G06F 3/041 | (2006.01) |
| H01L 51/44 | (2006.01) |
| H01L 51/52 | (2006.01) |
| C08K 7/06 | (2006.01) |

(52) U.S. Cl.
CPC ................. *C09D 5/24* (2013.01); *C09D 7/70* (2018.01); *C09D 165/00* (2013.01); *H01B 1/124* (2013.01); *H01B 1/22* (2013.01); *C08K 7/06* (2013.01); *C08K 7/24* (2013.01); *C08K 2201/001* (2013.01); *C08K 2201/011* (2013.01); *G06F 3/041* (2013.01); *H01L 51/0021* (2013.01); *H01L 51/0035* (2013.01); *H01L 51/0037* (2013.01); *H01L 51/442* (2013.01); *H01L 51/5206* (2013.01); *H01L 51/5234* (2013.01)

(58) Field of Classification Search
CPC ...... C09D 5/24; C09D 7/1291; C09D 165/00; H01L 51/442; H01B 1/124
USPC ......................................................... 428/323
See application file for complete search history.

(56) References Cited

U.S. PATENT DOCUMENTS

| | | | | |
|---|---|---|---|---|
| 2010/0247870 A1* | 9/2010 | Suzuki | ................. | B22F 1/0059 428/172 |
| 2012/0104374 A1* | 5/2012 | Allemand | ................ | H01B 1/02 257/40 |
| 2012/0138913 A1* | 6/2012 | Alsayed | ................ | B22F 1/0025 257/40 |

FOREIGN PATENT DOCUMENTS

WO  WO-2009063744 A1  5/2009

OTHER PUBLICATIONS

International Search Report issued in PCT/EP2015/067066 dated Sep. 22, 2015.

* cited by examiner

*Primary Examiner* — Hui H Chin
(74) *Attorney, Agent, or Firm* — Blank Rome LLP

(57) ABSTRACT

The present invention relates to a composition comprising i) particles comprising a conductive polymer, ii) metal nanowires, and iii) at least one solvent, wherein at least one of the following conditions is satisfied: α1) the particles comprising the conductive polymer are characterized by a weight average particle diameter of less than 100 nm; α2) the content of cations of the metal on which the metal nanowires ii) are based is below 500 ppm, based on the total weight of the composition; α3) the composition comprises, in addition to component iii), at least one high-boiling solvent that is miscible with the at least one solvent iii) and that has a boiling point (determined at 1013 mbar) of more than 100° C.

9 Claims, No Drawings

FORMULATIONS COMPRISING METAL NANOWIRES AND PEDOT

This application is a national stage of International Patent Application No. PCT/EP2015/067066, filed Jul. 24, 2015, which claims the benefit of European Patent Application No. 14002584.2, filed Jul. 25, 2014, each of which is hereby incorporated by reference in its entirety.

The present invention relates to a composition which comprises at least one solvent, metal nanowires and particles comprising a conductive polymer, a process for the production of a layered body, the layered body obtainable by this process, to a layered body comprising a substrate and an electrically conductive layer coated onto a surface of this substrate, and to the use of a composition.

Conductive polymers are increasingly gaining economic importance, since polymers have advantages over metals with respect to processability, weight and targeted adjustment of properties by chemical modification. Examples of known it-conjugated polymers are polypyrroles, polythiophenes, polyanilines, polyacetylenes, polyphenylenes and poly(p-phenylenevinylenes). Layers of conductive polymers are employed in diverse industrial uses, e.g. as polymeric counter-electrodes in capacitors or for through-plating of electronic circuit boards. The preparation of conductive polymers is carried out chemically or electrochemically by oxidation from monomeric precursors, such as e.g. optionally substituted thiophenes, pyrroles and anilines and the particular optionally oligomeric derivatives thereof. In particular, chemically oxidative polymerization is widely used, since it is easy to realize industrially in a liquid medium or on diverse substrates.

A particularly important polythiophene which is used industrially is poly(3,4-ethylenedioxythiophene) (PEDOT or PEDT), which is described, for example, in EP 0 339 340 A2 and is prepared by chemical polymerization of 3,4-ethylenedioxythiophene (EDOT or EDT), and which has very high conductivities in its oxidized form. An overview of numerous poly(3,4-alkylenedioxythiophene) derivatives, in particular poly(3,4-ethylenedioxythiophene) derivatives, and their monomer units, syntheses and uses is given by L. Groenendaal, F. Jonas, D. Freitag, H. Pielartzik & J. R. Reynolds, Adv. Mater. 12, (2000) p. 481-494. The dispersions, disclosed for example in EP 0 440 957 A2, of PEDOT with polyanions, such as e.g. polystyrenesulphonic acid (PSS), have acquired particular industrial importance (PEDOT/PSS dispersions). Transparent, conductive films which have found a large number of uses, e.g. as a hole injection layer in organic light-emitting diodes (OLED) or as an intermediate layer in organic photovoltaic elements (OPV elements), can be produced from these dispersions. Due to the polyelectrolyte properties of PEDOT as a polycation and PSS as a polyanion, the PEDOT/PSS compositions are not a true solution, but rather a dispersion. The extent to which polymers or parts of the polymers are dissolved or dispersed in this context depends on the weight ratio of the polycation and the polyanion, on the charge density of the polymers, on the salt concentration of the environment and on the nature of the surrounding medium (V. Kabanov, Russian Chemical Reviews 74, 2005, 3-20).

OLED and OPV elements as a rule comprise a layer of indium tin oxide (ITO) as a conductive substrate layer. However, efforts are currently being made to dispense with the use of ITO, since in contrast to conductive polymer layers, for example, this is not flexible. The disadvantage of the PEDOT/PSS-comprising dispersions known from the prior art is, however, that the conductivity of these layers is too low for them to be employed not only as a hole injection layer in an OLED or as an intermediate layer between the ITO-coated substrate and the semiconductor layer in the standard construction of a P3HT:PCBM solar cell, but as a simultaneous substitute for the underlying ITO layer. So that layers comprising conductive polymers can replace the ITO layers in OLED and OPV elements, they must have a particularly high conductivity (or a low surface resistance), with at the same time a high transmission.

Alternative materials which can be employed as an ITO substitute, such as, for example, metal nanowires, are already known from the prior art. The production of metal nanowires, and in particular the production of silver nanowires by the polyol process are known (e.g. DE-A-10 2010 017706, U.S. Pat. No. 7,585,349 or also WO-A-2008/073143). A polyol serves here both as a solvent and as a reducing agent for silver salts, preferably silver nitrate, a dispersing agent, such as polyvinylpyrrolidone (PVP), and a halide source being available. The mixture of the components is chosen such that a specific growth of the wires along a preferred crystal axis develops. Anisotropic conductive bars having an aspect ratio of at least 10:1 to 1,000:1 are formed by this means.

By application of these nanowires to a substrate, electrically conductive films of low surface resistance (SR) and high conductivity and a transparency of >80% can be achieved when the percolation threshold is exceeded. These can be applied both to glass and especially to flexible substrates and show a constant conductivity even after bending. By suitable structuring these transparent electrodes can be used inter alia as an ITO substitute in electronic equipment, such as LCD or plasma screens, touch screens and organic light-emitting diodes.

The silver nanowires can be applied in the form of dispersions, for example by spin coating, spray coating or by "stamping on". However, if the silver nanowires are processed from a dispersion without a film-forming agent, the silver nanowires show only a poor adhesion to the surface and due to the loose bond they are often only inadequately in contact and show relatively high surface resistances. This makes it necessary to press the layers in order to increase the conductivity, and/or to cover them with a further layer, for example a layer of a $TiO_2$ sol/gel (Yang et al. ACS Nano 2011, 5, 9,877-9,882). Coatings with conductive materials, in particular conductive polymers, are furthermore proposed in the patent literature, as is described, for example in WO-A-2011/041232 or WO-A-2008/131304. A stamping process in which the dry silver nanowires are applied to a prefabricated PEDOT/PSS layer is also known (Peumans et al. Adv. Mater. 2011, 23, 2905-2910).

The approaches described above for application of a conductive layer comprising silver nanowires to a substrate are technically comparatively challenging. However, a simple application of conductive layers by means of simple coating processes is desirable for use on an industrial scale. US-A-2012/0104374 describes the combining of a silver nanowire suspension with neutral to alkaline PEDOT/PSS materials and uses these formulations for coating by spin coating. However, the compositions disclosed in US-A-2012/0104374 are characterized in the coating prepared from these compositions often show an insufficient transmission, conductivity and/or haze. In addition such formulations exhibit high viscosity which makes them difficult to handle and excludes their use in certain applications where low viscosity is required. On top the viscosity increases over time which is not tolerable for industrial processing. The present invention was based on the object of overcoming the disadvantages resulting from the prior art in connection with compositions comprising metal nanowires and conductive polymers such as PEDOT/PSS, in particular in connection with the use of such compositions for the production of conductive layers which are suitable as an ITO substitute.

In particular, the present invention was based on the object of providing a composition comprising metal nanowires and conductive polymers such as PEDOT/PSS wherein the compositions have, compared to the formulations obtained from prior art, an improved viscosity and stability of viscosity over storage time. The compositions can be used to prepare transparent, conductive coatings, wherein these coatings are, compared to the coatings obtained from prior art compositions, characterized by an improved balance of the properties transmission, conductivity and haze.

A contribution towards achieving the abovementioned objects is made by a composition comprising
i) particles comprising a conductive polymer,
ii) metal nanowires, and
iii) at least one solvent,
wherein at least one of the following conditions is satisfied:
α1) the particles comprising the conductive polymer are characterized by a weight average diameter less than 100 nm;
α2) the content of cations of the metal on which the metal nanowires ii) are based is below 500 ppm, based on the total weight of the composition;
α3) the composition comprises, in addition to component iii), at least one high-boiling solvent that is miscible with the at least one solvent iii) and that has a boiling point (determined at 1013 mbar) of more than 100° C.

The composition according to the present invention comprises, as component i), particles comprising a conductive polymer, wherein the conductive polymer is preferably selected from the group consisting of an optionally substituted polythiophene, an optionally substituted polypyrrole, an optionally substituted polyaniline or a mixture of at least two of these polymers. In this context, optionally substituted polythiophenes are particularly preferred as the conductive polymer, in particular polythiophenes having the general formula

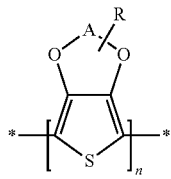

in which
A represents an optionally substituted $C_1$-$C_5$-alkylene radical,
R represents a linear or branched, optionally substituted $C_1$-$C_{18}$-alkyl radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or a hydroxyl radical, wherein 0 to 8 radicals R can be bonded to A and, in the case of more than one radical, can be identical or different.

The polythiophenes preferably in each case carry H on the end groups.

In the context of the invention, $C_1$-$C_5$-alkylene radicals A are preferably methylene, ethylene, n-propylene, n-butylene or n-pentylene. $C_1$-$C_{18}$-alkyl R preferably represent linear or branched $C_1$-$C_{18}$-alkyl radicals, such as methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or n-octadecyl, $C_5$-$C_{12}$-cycloalkyl radicals R represent, for example, cyclopentyl, cyclohexyl, cycloheptyl, cyclooctyl, cyclononyl or cyclodecyl, $C_5$-$C_{14}$-aryl radicals R represent, for example, phenyl or naphthyl, and $C_7$-$C_{18}$-aralkyl radicals R represent, for example, benzyl, o-, m-, p-tolyl, 2,3-, 2,4-, 2,5-, 2,6-, 3,4-, 3,5-xylyl or mesityl. The preceding list serves to illustrate the invention by way of example and is not to be considered conclusive.

In the context of the invention, numerous organic groups are possible as optionally further substituents of the radicals A and/or of the radicals R, for example alkyl, cycloalkyl, aryl, aralkyl, alkoxy, halogen, ether, thioether, disulphide, sulphoxide, sulphone, sulphonate, amino, aldehyde, keto, carboxylic acid ester, carboxylic acid, carbonate, carboxylate, cyano, alkylsilane and alkoxysilane groups and carboxamide groups.

Polythiophenes in which A represents an optionally substituted $C_2$-$C_3$-alkylene radical are particularly preferred. Poly(3,4-ethylenedioxythiophene) is very particularly preferred as the polythiophene.

The polythiophenes can be neutral or cationic. In preferred embodiments they are cationic, "cationic" relating only to the charges on the polythiophene main chain. The polythiophenes can carry positive and negative charges in the structural unit, depending on the substituent on the radicals R, the positive charges being on the polythiophene main chain and the negative charges optionally being on the radicals R substituted by sulphonate or carboxylate groups. In this context, the positive charges of the polythiophene main chain can be partly or completely satisfied by the anionic groups optionally present on the radicals R. Overall, in these cases the polythiophenes can be cationic, neutral or even anionic. Nevertheless, in the context of the invention they are all regarded as cationic polythiophenes, since the positive charges on the polythiophene main chain are the deciding factor. The positive charges are not shown in the formulae, since their precise number and position cannot be determined absolutely. However, the number of positive charges is at least 1 and at most n, where n is the total number of all recurring units (identical or different) within the polythiophene.

For compensation of the positive charge of the polythiophene, the particles comprising the conductive polymer furthermore comprise a polyanion which is preferably based on polymers functionalized with acid groups. Anions of polymeric carboxylic acids, such as polyacrylic acids, polymethacrylic acid or polymaleic acids, or of polymeric sulphonic acids, such as polystyrenesulphonic acids and polyvinylsulphonic acids, are possible in particular as the polyanion. These polycarboxylic and -sulphonic acids can also be copolymers of vinylcarboxylic and vinylsulphonic acids with other polymerizable monomers, such as acrylic acid esters and styrene. Polyanions which are furthermore possible are perfluorinated, colloid-forming polyanions, which are commercially obtainable, for example, under the name Nafion®. The molecular weight of the polymers which are functionalized with acid groups and supply the polyanions is preferably 1,000 to 2,000,000, particularly preferably 2,000 to 500,000. The polymers functionalized with acid groups or their alkali metal salts are commercially obtainable, e.g. polystyrenesulphonic acids and polyacrylic acids, or can be prepared by known processes (see e.g. Houben Weyl, Methoden der organischen Chemie, vol. E 20 Makromolekulare Stoffe, part 2, (1987), p. 1141 et seq.).

Polymers functionalized with acid groups (polyanions) and polythiophenes, in particular polystyrenesulphonic acid and poly(3,4-ethylenedioxythiophene), can be present in the particles of the conductive polymer i) in a weight ratio of from 0.5:1 to 50:1, preferably from 1:1 to 30:1, particularly preferably 1:1 to 20:1. The weight of the electrically conductive polymers here corresponds to the weight of the monomers employed for the preparation of the conductive polymers, assuming that complete conversion takes place during the polymerization.

Preferably, the particles comprising the conductive polymer i) comprise complexes of a polythiophene and a polyanion, particularly preferably PEDOT/PSS complexes. Such complexes are obtainable by polymerizing the thiophene monomers, preferably 3,4-ethylenedioxythiophene, oxidatively in aqueous solution in the presence of the polyanions, preferably the polystyrenesulphonic acid. In this context it is particularly preferred that particles comprising a conductive polymer i) are used that have been obtained by polymerizing thiophene monomers, in particular 3,4-ethylenedioxythiophene, in the presence of the polyanions, in particular polystyrene sulfonic acid, under a pressure below atmospheric pressure (i. e. 1013.25 hPa at sea level), preferably under a pressure of below 800 hPa, more preferably under a pressure of below 200 hPa and most preferably under a pressure of below 50 hPa.

The composition according to the present invention comprises, as component ii), metal nanowires, preferably nanowires based on a metal selected from the group consisting of silver, copper, gold and platinum, wherein the use of silver nanowires is particularly preferred. Preferably, the metal nanowires ii), in particular the silver nanowires, contained in the composition according to the present invention are characterized by a length of from 1 μm to 200 μm and by a diameter of from 50 nm to 1,300 nm. Preferably, the metal nanowires have an aspect ratio (length:diameter) of at least 10:1, more preferably of at least 100:1 and most preferably they have an aspect ratio in a range of from 100:1 to 1,000:1.

Suitable silver nanowires that can be used as component ii) in the composition according to the present invention can be obtained by a process comprising the process steps:
a) the reduction of silver salts by means of a polyol serving as a solvent and reducing agent in the presence of a non-conductive polymer and subsequent precipitation of the silver nanowires formed thereby to obtain silver nanowires, on the surface of which at least some of the non-conductive polymer is adsorbed;
b) the at least partial removal of the non-conductive polymer adsorbed on the surface of the silver nanowires to obtain purified silver nanowires;

In process step a) silver salts are first reduced by means of a polyol serving as a solvent and reducing agent in the presence of a non-conductive polymer, and the silver nanowires formed by this procedure are then precipitated. This fundamental principle of the production of silver nanowires is adequately known from the prior art, for example from DE-A-10 2010 017706.

Process step a) can accordingly include, for example, the part steps:
a1) The provision of a reaction mixture comprising a polyol, a non-conductive polymer which adsorbs on to a silver surface, a chemical which forms a halide and/or one which forms a pseudohalide and a chemical which forms a redox pair, chosen from the group consisting of bromine, iodine, copper, vanadium and mixtures thereof;
a2) the addition of a silver salt in an amount such that the concentration of silver in the reaction mixture is at least 0.5 wt.-%, based on the total weight of the reaction mixture;
a3) the reduction of the silver salt at a temperature of the reaction mixture of at least 75° C. for the duration of the reaction;
a4) the separating off of the silver nanowires from the reaction mixture.

In this connection—just as in DE-A-10 2010 017706—it should be pointed out that the definition of the reaction mixture constituents "a chemical which forms a halide and/or one which forms a pseudohalide" and "a chemical which forms a redox pair, chosen from the group consisting of bromine, iodine, copper, vanadium and mixtures thereof" overlap. The chemicals bromine and iodine which form a redox pair are halogens which, in the form of one of their salts, are both a "salt of a halide" and a "chemical which forms a redox pair, chosen from the group consisting of bromine and iodine".

Those compounds which are preferred as polyols, as non-conductive polymers which adsorb on to a silver surface (in DE-A-10 2010 017706 called "an organic chemical which adsorbs on to a silver surface"), as a chemical which forms a halide and/or a pseudohalide, as a chemical which forms a redox pair, chosen from the group consisting of bromine, iodine, copper, vanadium and mixtures thereof, and as a silver salt are the compounds which are already mentioned as preferred in DE-A-10 2010 017706.

Preferred polyols are accordingly chosen from the group consisting of 1,2-ethanediol, 1,2-propanediol, 1,3-propanediol, 1,2-butanediol, 1,3-butanediol, 1,4-butanediol, 2,3-butanediol, 1,5-pentanediol, 1,6-hexanediol, glycerol, trimethylolpropane, pentaerythritol, triethanolamine, trihydroxymethylaminomethane, ethylene glycol, diethylene glycol, triethylene glycol, propylene glycols, dipropylene glycols and a polyethylene glycol which is liquid at the reaction temperature, such as, for example, polyethylene glycol 300. Very particularly preferred polyols are chosen from the group consisting of glycerol, ethylene glycol, tetraethylene glycol, 1,2-propanediol, dipropylene glycol, 1,2-butanediol, 1,3-butanediol, 1,4-butanediol and 2,3-butanediol, the use of ethylene glycol and glycerol being most preferred.

The non-conductive polymer which adsorbs on to the silver surface is required in the polyol process for formation of the desired wire-shaped morphology. In principle, all those compounds which are mentioned in WO-A-2009/128973 on pages 19 to 27 (paragraphs [0095] to [0116]) under the heading "Organic Protective Agent(s) (OPA)" can be employed as the nonconductive polymer. Preferred non-conductive polymers which adsorb on to a silver surface, however, are those having a weight-average molecular weight, preferably determined by gel permeation chromatography, of at least 100,000 g/mol, still more preferably at least 250,000 g/mol and most preferably at least 500,000 g/mol. In this connection, very particularly preferred non-conductive polymers are chosen from the group consisting of polyvinylpyrrolidone (PVP), polyvinyl alcohol (PVA) and mixtures of various grades (molecular weights) and copolymers of these polymers. Suitable comonomers are e.g. N-vinylimidazole, vinyl acetate and vinylcaprolactam. However, the use of polyvinylpyrrolidone having a molecular weight of at least 100,000 g/mol, still more preferably at least 250,000 g/mol and most preferably at least 500,000 g/mol is most preferred as the non-conductive polymer.

The chemical which forms a halide is preferably a salt of a halide, particularly preferably NaCl, NaBr, NaI, KCl, KBr, KI or a mixture of at least two of these, or elemental bromine, elemental iodine or a mixture of at least two of these, while the chemical which forms the pseudohalide is preferably a salt of a pseudohalide, particularly preferably NaSCN, KSCN or a mixture of these.

The chemical which forms a redox pair is preferably elemental copper, elemental vanadium, a copper oxide, a vanadium oxide, a copper hydroxide, a vanadium hydroxide, a copper sulphate, a vanadium sulphate, a copper nitrate, a vanadium nitrate, a vanadium trichloride or a mixture of these compounds. The chemical which forms a halide and the chemical which forms a redox pair are preferably already present in the reaction mixture provided in process step a1). These chemicals (or at least one of these chemicals), however, can also be added only subsequently, for example together with or after the addition of the silver salt in process step a2).

With respect to the presence of possible further additives in the reaction mixture provided in process step a1) and the relative amounts in which the particular components are present in this mixture, reference is made to the teaching of DE-A-10 2010 017706, the disclosure content of which is a constituent of the disclosure of the present application with respect to the production of silver nanowires.

In process step a2), a silver salt is then added in an amount such that the concentration of silver in the reaction mixture is at least 0.5 wt.-%, based on the total weight of the reaction mixture, it being possible for the silver salt to be added, for example, at a temperature of the reaction mixture of at least 75° C., particularly preferably at least 100° C. $AgNO_3$ is preferred as the silver salt, and is added to the reaction in the form of a solution or directly as a solid. A suitable solvent for the silver salt is, inter alia, the polyol employed in the reaction, that is to say preferably ethylene glycol and/or glycerol. The addition can take place all at once, in portions or continuously over a relatively long period of time. The silver salt is added at the reaction temperature. The silver salt is added in an amount which corresponds mathematically to a silver concentration of at least 0.5 wt.-% in the reaction mixture. In preferred embodiments of the process for the production of silver nanowires, silver is present in a concentration of at least 0.75 wt.-%, more preferably of at least 1.0 wt.-%, most preferably of at least 1.5 wt.-%.

In process step a3), the silver salt is then reduced, this reduction preferably being carried out at a temperature of at least 75° C., particularly preferably of at least 100° C. and still more preferably of at least 120° C. for the duration of the reaction. As already described in DE-A-10 2010 017706, the formation of the silver nanowires can be readily monitored visually when carrying out this process. When the reaction has ended, the reaction mixture can be allowed to cool. A reaction mixture comprising silver nanowires, on the surface of which at least some of the non-conductive polymer is adsorbed, is obtained. The silver nanowires can then be separated off from this reaction mixture in a further part step a4), for example by precipitation after dilution of the reaction mixture by the addition of suitable solvents, such as, for example, acetone, tetrahydrofuran or ethyl acetate, or after addition of chemicals which modify the electrical double layer. The silver nanowires precipitated out in this manner can then be separated off from the liquid phase by processes known to the person skilled in the art, for example by centrifugation, filtration or by decanting.

In process step b) the non-conductive polymer adsorbed on the surface of the silver nanowires is at least partially removed to obtain purified silver nanowires. In particular, it is preferable in this connection to remove in process step b) the non-conductive polymer adsorbed on the surface of the silver nanowires to an extent such that the weight ratio of silver:adsorbed nonconductive polymer is increased by a factor of at least 2, particularly preferably at least 5 and most preferably at least 10, starting from the weight ratio present after process step a) has ended.

The at least partial removal of the non-conductive polymer adsorbed on the surface of the silver nanowires is preferably carried out by washing the silver nanowires obtained in process step a) with a solvent in which the non-conductive polymer is at least partly soluble. In this connection it has proved to be particularly advantageous if process step b) includes the following part steps:

b1) the suspending of the silver nanowires obtained in process step a) in a solvent, in which the non-conductive polymer adsorbed on the surface of the silver nanowires is at least partly soluble;

b2) the separating of the suspended silver nanowires.

Possible solvents which are employed in process step b1) and in which the non-conductive polymer adsorbed on the surface of the silver nanowires is at least partly soluble are, if polyvinylpyrrolidone is used as the non-conductive polymer, in particular water, alcohols, such as methanol or ethanol, or mixtures of these. In this connection it is furthermore preferable for the silver nanowires to be suspended at a temperature in a range of from 15 to 100° C., particularly preferably in a range of from 20 to 50° C. for a duration of from 1 minute to 5 hours, particularly preferably for a duration of from 5 minutes to 60 minutes. It is furthermore preferable for the silver nanowires to be suspended in an amount of from 1 g to 100 g, particularly preferably in an amount of from 2.5 g to 25 g of solvent per gram of silver nanowires obtained in process step a), preferably per gram of the composition obtained in process step a4) after the silver nanowires have been separated off.

The separating of the suspended silver nanowires in process step b2) is preferably again carried out by processes known to the person skilled in the art, particularly preferably by centrifugation.

It has furthermore proved advantageous to purify the silver nanowires several times in succession, but particularly preferably twice, three times, four times or five times, by means of the washing process described by part steps b1) and b2), it having be found that the amount of non-conductive polymer adsorbed on the surface of the silver nanowires can be constantly reduced with an increasing number of washing steps.

A continuous washing in which the silver nanowires obtained in process step a) are brought into contact continuously with a solvent in which the non-conductive polymer adsorbed on the surface of the silver nanowires is at least partly soluble is also conceivable. This can be carried out, for example, by dialysis.

It is particularly preferable in this connection, if polyvinylpyrrolidone is used as the nonconductive polymer, for the nitrogen content of the purified silver nanowires obtained in process step bi) to be less than 7 wt.-%, particularly preferably less than 2.5 wt.-% and most preferably less than 1 wt.-%, in each case based on the total weight of the drying residue of the purified silver nanowires.

The composition according to the present invention comprises, as component iii), at least one solvent. Preferred solvents are water, aliphatic alcohols, such as methanol, ethanol, i-propanol and n-butanol, ethylene glycol, propylene glycol and mixtures of water and one or more of these alcohols, wherein the use of water as solvent iii) being most preferred in particular in the case of PEDOT/PSS complexes as the conductive polymer.

The composition according to the present invention can be prepared by mixing the metal nanowires ii), preferably the purified silver nanowires obtained in process step b), with an aqueous dispersion comprising the particles comprising a conductive polymer i), preferably with a dispersion comprising particles comprising complexes of a polythiophene and a polyanion, particularly preferably PEDOT/PSS complexes and water as solvent the solvent iii). The solids content of such dispersions is conventionally in a range of from 0.1 to 10 wt.-%, particularly preferably in a range of from 1 to 5 wt.-%. However, it is also conceivable to prepare the particles comprising a conductive polymer in the presence of the purified silver nanowires in that polymerizable precursors of the conductive polymer (e.g. 3,4-ethylenedioxythiophene in the case of poly(3,4-ethylenedioxythiophene) as the conductive polymer) are polymerized in the presence of the purified silver nanowires and in the presents of polyanions, such as polystyrenesulphonic acid.

It is furthermore preferred that the composition according to the present invention comprises the metal nanowires ii), preferably the silver nanowires, and the particles comprising the conductive polymer i) in a relative amount such that the weight ratio of metal contained in the metal nanowires:conductive polymer in the dispersion is in a range of from 10:1 to 1:10, particularly preferably in a range of from 5:1 to 1:5 and most preferably in a range of from 2:1 to 1:2. If the complexes described above of polythiophenes and polyanions are employed as conductive polymer, the above stated relative amounts relate to the weight ratio of metal contained in the metal nanowires:total amount of polythiophenes and polyanions.

In addition to components i), ii) and iii) the composition according to the present invention may comprise further additives iv), such as, for example, antioxidants, adhesion promoters, acids or bases for regulation of the pH, binders, crosslinking agents, surfactants or other additives known to the person skilled in the art as additives in particular for PEDOT/PSS dispersions.

Surfactant is understood as meaning amphiphilic substances which have a hydrophilic head group and a hydrophobic part. The hydrophilic group can be either ionic or nonionic in nature. Due the molecular structure and the tendency to accumulate at interfaces, this substance class lowers the interfacial tension and leads to improved wetting properties. Suitable surfactants are, in particular, anionic surfactants, such as e.g. alkylbenzenesulphonic acids and salts, paraffinsulphonates, alcohol sulphonates, ether sulphonates, sulphosuccinates, phosphate esters, alkyl ether carboxylic acids or carboxylates, cationic surfactants, such as e.g. quaternary alkylammonium salts, nonionic surfactants, such as e.g. linear or branched alcohol ethoxylates, oxo alcohol ethoxylates, alkylphenol ethoxylates or alkyl polyglucosides. Representative examples of suitable surfactants include fluorosurfactants such as ZONYL® surfactants, including ZONYL® FSN, ZONYL® FSO, ZONYL® FSA, ZONYL® FSH (DuPont Chemicals, Wilmington, Del.), and NOVEL® (3M, St. Paul, Minn.). Other exemplary surfactants include nonionic surfactants based on alkylphenol ethoxylates. Preferred surfactants include, for example, octylphenol ethoxylates such as TRITON® (x100, x114, x45), and secondary alcohol ethoxylates such as TERGITOL® 15-S series (Dow Chemical Company, Midland Mich.). Further exemplary non-ionic surfactants include acetylenic-based surfactants such as DYNOL® (604, 607) (Air Products and Chemicals, Inc., Allentown, Pa.), n-dodecyl [beta]-D-maltoside and alcohol ethoxylates such as TERGITOL® TMN.

Antioxidants are reagents which prevent the oxidative degradation of materials, which is often promoted by UV light. In the case of a use of polythiophenes as the conductive polymer, aromatic polyhydroxy compounds have proved suitable. Antioxidants which are particularly preferred according to the invention are gallic acid and the propyl esters of gallic acid, since they have an inhibiting effect in the conductive layers produced from the composition. Within a month, under the same storage conditions as the non-protected layer, the value can be kept below 60Ω/□. The amount in which the gallic acid or the propyl esters of gallic acid are employed in the process according to the invention is preferably in a range of from 0.001 to 5 wt.-%, particularly preferably in a range of from 0.005 to 1 wt.-% and most preferably in a range of from 0.01 to 0.2 wt.-%, in each case based on the total weight of the composition according to the present invention.

Possible adhesion promoters are, in particular, organofunctional silanes and hydrolysates thereof, e.g. 3-glycidoxypropyltrialkoxysilane, 3-aminopropyltriethoxysilane, 3-mercaptopropyltrimethoxysilane, 3-methacryloxypropyltrimethoxysilane, vinyltrimethoxysilane or octyltriethoxysilane, while crosslinking agents which can be employed are melamine compounds, masked isocyanates, functional silanes—e.g. tetraethoxysilane, alkoxysilane hydrolysates, e.g. based on tetraethoxysilane, epoxysilanes, such as 3-glycidoxypropyltrialkoxysilane, epoxides or oxetanes.

Suitable binders are water-soluble binders such as polyvinyl alcohol and derivatives thereof, starch, SBR latex, gelatin, alginates, carboxycellulose and hydroxyalkyl cellulose materials, polyacrylic acid and derivatives thereof, polyvinyl pyrrolidone, casein, polyethylene glycol, polyurethanes (for example, a modified polyurethane resin dispersion), polyamide resins (for instance, an epichlorohydrin-containing polyamide) or mixtures of at least two of these polymers.

Preferred bases for regulation of the pH are, in addition to ammonia, alkali metal hydroxides and alkaline earth metal hydroxides, in particular amines, particularly preferably primary, secondary or tertiary amines in which the alkyl groups are chosen from the group consisting of methyl-, ethyl-, n-propyl- or iso-propyl-. An example of a suitable amine is dimethylaminoethanol.

It is furthermore preferable according to the invention to establish a pH in a range of from 2 to 7, very particularly preferably in a range of from 4 to 6 in the compositions.

The composition according to the present invention is now characterized in that at least one of the following conditions is satisfied:

α1) the particles comprising the conductive polymer are characterized by a weight average particle diameter of less than 100 nm, preferably less than 90 nm, more preferably less than 80 nm, even more preferably less than 70 nm, even more preferably less than 60 nm and most preferably less than 50 nm;

α2) the content of cations of the metal on which the metal nanowires ii) are based is below 500 ppm, preferably less than 400 ppm, more preferably less than 300 ppm, even more preferably less than 200 ppm nm, even more preferably less than 100 ppm and most preferably less than 80 ppm, in each case based on the total weight of the composition;

α3) the composition comprises, in addition to component iii), at least one high-boiling solvent that is miscible with the at least one solvent iii) and that has a boiling point (determined at 1013 mbar) of more than 100° C., preferably more than 110° C., more preferably more than 120° C., even more preferably more than 130° C., even more preferably more than 140° C. and most preferably more than 150° C.

Particularly preferred compositions according to the present invention are compositions that satisfy the following conditions or combination of conditions: α1), α2), α3), α1)α2), α1)α3), α2)α3) and α1)α2)α3).

The weight average particle diameter defined in condition α1) relates to a weight distribution of the particles comprising the conductive polymer i) in the composition according to the present invention as a function of the particle diameter. It is determined, for example, via an ultracentrifuge measurement. The general method is described in Colloid Polym. Sci. 267, 1113-1116 (1989). In the case of particles which swell in the composition, the particle size in the swollen state is determined.

In connection with condition α1) it is also preferred that the particles comprising the conductive polymer i) in the composition according to the present invention have a $d_{10}$ value of greater than 1 nm and a $d_{90}$ value of less than 400 nm, particularly preferably a $d_{10}$ value of greater than 5 nm and a $d_{90}$ value of less than 200 nm, very particularly preferably a $d_{10}$ value of greater than 10 nm and a $d_{90}$ value of less than 60 nm. In this context, the $d_{10}$ value of the diameter distribution states that 10% of the total weight of all the particles comprising the conductive polymer i) in the composition according to the present invention can be assigned to those particles which have a diameter of less than or equal to the $d_{10}$ value. The d90 value of the diameter distribution states that 90% of the total weight of all the particles comprising the conductive polymer i) in the composition according to the present invention can be assigned to those particles which have a diameter of less than or equal to the $d_{90}$ value.

According to condition α2) the content of cations of the metal on which the metal nanowires ii) are based is below 500 ppm, preferably less than 400 ppm, more preferably less than 300 ppm, even more preferably less than 200 ppm even more preferably less than 100 ppm and most preferably less than 80 ppm, in each case based on the total weight of the composition. In this context it is particularly preferred that cations of the metal that are contained in the composition according to the present invention in the maximum amounts given above are silver cations ($Ag^+$).

According to condition α3) the composition comprises, in addition to component iii), at least one high-boiling solvent that is miscible with the at least one solvent iii) and that has a boiling point (determined at 1013 mbar) of more than 100° C., preferably more than 110° C., more preferably more than 120° C., even more preferably more than 130° C., even more preferably more than 140° C. and most preferably more than 150°. According to a particularly preferred embodiment of the composition according to the present invention the at least one solvent iii) is water and the high-boiling solvent is selected from the group consisting of propylene glycol, ethylene glycol, dimethylsulphoxide (DMSO), methylacetamide, dimethylacetamide, dimethylformamide, N-methylpyrrolidone, N-cyclohexylpyrrolidone or a mixture of at least two of these solvent, wherein DMSO is most preferred. Addition of these high-boiling solvents to an aqueous composition according to the present invention in an amount of 1 to 10 wt.-%, preferably 2 to 5 wt.-%, leads to a significant increase in conductivity in the film formation. In this context it is particularly preferred that the composition comprises at least 50 wt.-%, preferably at least 60 wt.-% and most preferably at least 70 wt.-% of water as the at least one solvent iii) and at least 1 wt.-%, preferably at least 2 wt.-% and most preferably at least 3 wt.-% DMSO as the high-boiling solvent, in each case based on the total weight of the composition.

A contribution towards achieving the abovementioned objects is also made by a process for the production of a layered body, comprising the process steps:

I) the provision of a substrate;
II) the application of a composition according to the present invention onto this substrate;
III) the at least partial removal of the at least one solvent iii) from the composition to obtain a layered body comprising an electrically conductive layer coated onto the substrate.

In process step I) a substrate is first provided, wherein the nature of the substrate depends on the intended purpose for which the composition according to the present invention is employed. If the dispersion is employed, for example, for the production of a hole injection layer in an OLED, the substrate can be, for example, a transparent electrode, such as ITO. Possible substrates are furthermore, in particular, films, particularly preferably polymer films, very particularly preferably polymer films of thermoplastic polymers, or glass plates.

In process step II) a composition according to the present invention is then applied onto the substrate, it being possible for this application to be carried out by known processes, e.g. by spin coating, impregnation, pouring, dripping on, spraying, misting, knife coating, brushing or printing, for example by ink-jet, screen, gravure, offset or tampon printing, in a wet film thickness of from, for example, 0.5 μm to 250 μm, preferably in a wet film thickness of from 2 μm to 50 μm.

In process step III), at least some of the at least one solvent iii) is then removed from the composition to obtain composition to obtain a layered body comprising an electrically conductive layer coated onto the substrate, this removal preferably being carried out by a drying at a temperature in a range of from 20° C. to 200° C. of the substrate coated with the composition.

A contribution towards achieving the abovementioned objects is also made by a layered body obtainable which is obtainable by the process described above.

A contribution towards achieving the abovementioned objects is also made by a layered body, comprising
I) a substrate, and
II) an electrically conductive layer coated onto this substrate, wherein the electrically conductive layer comprises a conductive polymer and metal nanowires and wherein the layered body is characterized by
β1) a transmission (Y) of at least 90%, preferably at least 95%, more preferably at least 96% and most preferably at least 96.5%,
β2) a surface resistance (SR) of less than 150Ω/□ more preferably less than 135Ω/□, more preferably less than 120Ω/□ and most preferably less than 105Ω/□ on the conductive layer,
and
β3) a haze (H) of less than 2,7, more preferably less than 2,4, and most preferably less than 2,2.

Preferred substrates are those mentioned in connection with the process for the production of a layered body described above and preferred conductive polymers and metal nanowires are those polymers and nanowires that have been described as preferred in connection with the composition according to the present invention.

A contribution towards achieving the abovementioned objects is also made by the use of the composition according to the present invention for the production of an electrically conductive layer in an OLED, an OPV element, a touch screen, for shielding from electromagnetic radiation ("EMI shielding"), in sensors, for the production of an IR reflection layer, in transparent heaters and in smart windows. However, the use of the composition according to the present invention as an ITO substitute in an OLED, an OPV element or a touch screen is very particularly preferred.

FURTHER EMBODIMENTS

I) A composition comprising
   i) particles comprising a conductive polymer,
   ii) metal nanowires, and
   iii) at least one solvent,
   wherein at least one of the following conditions is satisfied:
   $\alpha 1$) the particles comprising the conductive polymer are characterized by a weight average particle diameter of less than 100 nm;
   $\alpha 2$) the content of cations of the metal on which the metal nanowires ii) are based is below 500 ppm, based on the total weight of the composition;
   $\alpha 3$) the composition comprises, in addition to component iii), at least one high-boiling solvent that is miscible with the at least one solvent iii) and that has a boiling point (determined at 1013 mbar) of more than 100° C.

II) The composition according to embodiment I, wherein the composition comprises at least 50 wt.-% of water as the at least one solvent iii) and at least 1 wt.-% of the at least one high-boiling solvent that is miscible with water and that has a boiling point (determined at 1013 mbar) of more than 100° C.

III) The composition according to embodiment II, wherein the high-boiling solvent that is miscible with water and that has a boiling point (determined at 1013 mbar) of more than 100° C. is DMSO.

IV) The composition according to anyone of embodiments I to III, wherein the composition further comprises iv) at least one surfactant.

V) The composition according to anyone of embodiments I to IV, wherein the metal on which the metal nanowires ii) are based is selected from the group consisting of silver, copper, gold and platinum.

VI) The composition according to anyone of embodiments I to V, wherein the metal nanowires ii) have an aspect ratio of at least 10:1.

VII) The composition according to anyone of embodiments I to VI, wherein the particles comprising a conductive polymer i) further comprise a polymeric anion.

VIII) The composition according to embodiment VII, wherein the polymeric anion is polystyrene sulfonic acid.

IX) The composition according to embodiment VIII, wherein the particles comprising the conductive polymer i) comprise a complex of poly(3,4-ethylenedioxythiophene) and polystyrene sulfonic acid (PEDOT:PSS).

X) The composition according to anyone of embodiments I to IX, wherein the composition comprises the particles of the conductive polymer i) and the metal nanowires ii) in such a relative amount that the weight ratio of metal contained in the metal nanowires:conductive polymer in the composition is in a range of from 10:1 to 1:10.

XI) The composition according to anyone of embodiments I to X, wherein the metal nanowires ii) are silver nanowires and wherein the content of silver cations in the composition is below 100 ppm, based on the total weight of the composition.

XII) A process for the production of a layered body, comprising the process steps:
   I) the provision of a substrate;
   II) the application of a composition according to one of embodiments I to XI onto this substrate;
   III) the at least partial removal of the at least one solvent iii) from the composition to obtain a layered body comprising an electrically conductive layer coated onto the substrate.

XIII) A layered body, obtainable by the process according to embodiment XII.

XIV) A layered body, comprising
   I) a substrate and
   II) an electrically conductive layer coated onto this substrate, wherein the electrically conductive layer comprises a conductive polymer and metal nanowires and wherein the layered body is characterized by
   $\beta 1$) a transmission (Y) of at least 95%,
   $\beta 2$) a surface resistance (SR) of less than 150Ω/□ on the conductive layer, and
   $\beta 3$) a haze (H) of less than 2,7.

XV) Use of the composition according to anyone of embodiments I to XI for the production of an electrically conductive layer in an OLED, an OPV element, a touch screen, for shielding from electromagnetic radiation ("EMI shielding"), in sensors or for the production of an IR reflection layer, in a transparent heater and in smart windows.

XVI) Use according to embodiment XV, wherein the composition is used as an ITO substitute in an OLED, an OPV element or a touch screen.

The invention is now explained in more detail with the aid of test methods and non-limiting examples.

Test Methods

Determination of the Surface Resistance

The surface resistance (SR) of the coatings is determined by means of the 4-point measurement method and stated in Ω/□.

Determination of the Transmission (T)

The transmission of the coated substrates is determined on a 2-channel spectrometer (Lambda 900, PerkinElmer). In order to rule out interferences of the scattered light here, the sample is measured in a photometer sphere (Ulbricht sphere), as a result of which scattered light and transmitted light are detected by the photodetector. The transmission is thus understood as meaning 1-absorption of the coating and of the substrate.

The transmission of the pure substrate is first measured. Melinex 506 films having a thickness of 175 μm are used as the substrate. Thereafter, the coated substrate is measured.

The transmission spectra are recorded in the range of visible light, i.e. from 320 nm to 780 nm with a step width of 5 nm.

The standard colour value Y of the sample is calculated from the spectra in accordance with DIN 5033, taking as the basis a 10° observer angle and light type D65. The internal transmission is calculated from the ratio of the standard colour values of the substrate with coating (Y) to that without coating ($Y_0$): The internal transmission corresponds to $Y/Y_0 \times 100$ in percent. For simplicity, only transmission is referred to the in the following.

Determination of the Haze (H)

Haze values were measured on a Haze-gard plus instrument from BYK Gardner (Geretsried).

Determination of Ion Content 30 g of formulation are centrifuged for 90 min at 4000 rpm, the supernatant is filtered through a 0.2 µm syringe filter (Celluloses Acetate, Satorius). The filtered supernatant is diluted with Milli-Q water containing 1% nitric acid in a ratio 1:20.

A calibration curve for silver is measured first, using different dilutions of a silver standard (ICP-Standard Silver 1000 ppm, Bernd Kraft GmbH, Duisburg).

The diluted sample is injected into a spray chamber (Burgener with cyclone chamber) of a ICP-OES (Spectroblue, SPECTRO Analytical Instruments GmbH & Co. KG, Kleve). The signal is processed and the amount calculated by using the software "Smart Analyzer Vision".

Determination of the Viscosity

Viscosities were determined on an Haake RV1 rheometer (Thermo Scientific, Karlsruhe, Germany) at a shear rate of 100 Hz and 20° C., using a double gap system DG 43.

EXAMPLES

Whenever coating properties are shown in the experimental section, the measurements were performed on coatings with a 6 µm wet-film thickness, coated with a 6 µm wire bare hand coater.

Example 1: Preparation of Silver Nanowire & Purification

Ethylene glycol (193 g, technical grade 98%, Applichem Darmstadt) is initially introduced into a round-bottomed flask and heated, and polyvinylpyrrolidone (4.5 g, Luvitec K90, BASF, Ludwigshafen) is introduced while hot. A solution of silver nitrate (4.5 g, 63.5% metal basis, Johnson Matthey, Enfield) in ethylene glycol (20.5 g) and a solution of vanadium chloride (9 mg, 99%, Merck, Darmstadt) in ethylene glycol (2.5 g) are then added and the mixture is heated to 120° C. The longitudinal growth of the nanowires is monitored under the microscope and after conclusion of the growth the reaction is stopped by pouring the hot reaction mixture into a water bath.

100 g of the crude mixture is centrifuged, the supernatant discarded. The precipitate is filled-up with water to 100 g and redispersed. Centrifugation, decanting and redispersing is repeated three times, after the last centrifugation less water is used for redispersion.

Example 2: Formulation with Small Particles 3.66 g silver nanowires as prepared above (1.6% silver content gravimetrically, 59 mg silver) were mixed with 4.8 g of water, 7.85 g Clevios PH 1000 (86 mg PEDOT/PSS, conductivity 904 S/cm, Heraeus Precious Metals GmbH & Co. KG, Leverkusen), 0.755 g dimethylsulfoxide (DMSO, ACS reagent, Sigma Aldrich, Munich) and 50 µL Triton X100 (Sigma Aldrich, Munich). The formulation was coated on Melinex 506 films (Pütz GmbH+Co. Folien KG. Taunusstein) using a 6 µm wet-film thickness wire bar hand coater (Erichsen K Hand Coater 620). Coatings were dried for 5 min at 120° C.

The particle size distribution for the gel particles in this PEDOT/PSS-grade is typically narrow, $d_{10}=16$ nm, $d_{50}=22$ nm and $d_{90}=35$ nm.

TABLE 1

Viscosity and evolution of viscosity over time

| | Viscosity [mPa · s] | |
|---|---|---|
| | initial | after 3 month |
| Example 2 | 13 | 13 |

Example 3: Formulation with Bigger Particles 3.66 g silver nanowires (1.6% silver content gravimetrically, 59 mg silver) were mixed with 4.8 g of water, 7.85 g Clevios P HC V6 (86 mg PEDOT/PSS, conductivity 845 S/cm, Heraeus Precious Metals GmbH & Co. KG, Leverkusen), 0.755 g dimethylsulfoxide (DMSO, ACS reagent, Sigma Aldrich, Munich) and 50 µL Triton X100 (Sigma Aldrich, Munich). The formulation was coated on Melinex 506 films (Pütz GmbH+Co. Folien KG. Taunusstein) using a 6 µm wet-film thickness wire bar hand coater (Erichsen K Hand Coater 620). Coatings were dried for 5 min at 120° C.

The particle size distribution for the gel particles in this PEDOT/PSS-grade is typically broader and particles are bigger, $d_{10}=32$ nm, $d_{50}=40$ and $d_{90}=97$ nm.

TABLE 2 influence of particle size

| Example | SR [Ω/sq] | Y65 [%] | H [%] |
|---|---|---|---|
| Example 2 | 96 | 97.5 | 2.02 |
| Example 3 | 120 | 97.5 | 2.01 |

Example 4: Half the Amount of High Boiling Solvent

A formulation according to Example 2 was produced, except that 50% of DMSO was substituted by water.

Example 5: Without High Boiling Solvent

A formulation with the same ingredients as in Example 2 was produced except, that DMSO as high boiling solvent was substituted by water.

Example 6: EG as High Boiling Solvent

A formulation with the same ingredients as in Example 2 was produced except, that DMSO as high boiling solvent was substituted by Ethylenglycol.

TABLE 3 influence of the high boiling solvent

| Example | SR [Ω/sq] | Y65 [%] | H [%] |
|---|---|---|---|
| Example 2 | 96 | 97.5 | 2.02 |
| Example 4 | 93 | 97.6 | 2.3 |
| Example 5 | 91750 | 97.7 | 2.03 |
| Example 6 | 654 | 97.6 | 1.93 |

Example 7

The silver ion content of the formulation was measured, therefore the AgNW were removed from the formulation by centrifugation and filtration through a syringe filter. The ion content was determined by ICP-OES.

The formulation contained 27 ppm of dissolved silver.

Example 8: Medium Silver Content (Comparative)

To a formulation according to Example 2 0.1% silver nitrate was added, by premixing silver nitrate with Clevios PH 1000, all other steps were conducted according to Example 2. The viscosity of the formulation after 4 days at room temperature significantly increased.

Example 9: High Silver Content (Comparative)

To a formulation according to Example 2 0.25% silver nitrate was added, by premixing silver nitrate with Clevios PH 1000. The viscosity of the formulation after 4 days at room temperature drastically increased. The formulation is showing gel particles and agglomerates of silver nanowires, indicating the destabilization of the formulation. That puts down the physical properties of the coatings and leads to a reduced process ability.

TABLE 4

Viscosity and evolution of viscosity over time

|  | Ag ion content | Viscosity increase after 4 days |
| --- | --- | --- |
| Example 2 | very low | 0% |
| Example 3 | very low | 7.36% |
| Example 8 | medium | 10% |
| Example 9 | high | 30% |

TABLE 5

Coating properties

| Example | SR [Ω/sq] | Y65 [%] | H [%] |
| --- | --- | --- | --- |
| Example 7 | 104 | 98.0 | 2.63 |
| Example 8 | 297 | 97.6 | 2.45 |
| Example 9 | 459 | 97.9 | 2.91 |

The invention claimed is:

1. A composition comprising
   i) particles comprising a conductive polymer, wherein the particles comprising the conductive polymer comprise a complex of poly(3,4-ethylenedioxythiophene) and polystyrene sulfonic acid (PEDOT:PSS),
   ii) metal nanowires, and
   iii) at least one solvent,
   wherein each of the following conditions are satisfied:
   α1) the particles comprising the conductive polymer are characterized by a weight average particle diameter of less than 60 nm;
   α2) the content of cations of the metal on which the metal nanowires ii) are based is below 500 ppm, based on the total weight of the composition; and
   α3) the composition comprises, in addition to component iii), at least one high-boiling solvent that is miscible with the at least one solvent iii) and that has a boiling point (determined at 1013 mbar) of more than 100° C.

2. The composition according to claim 1, wherein the composition comprises at least 50 wt.-% of water as the at least one solvent iii) and at least 1 wt.-% of the at least one high-boiling solvent that is miscible with water and that has a boiling point (determined at 1013 mbar) of more than 100° C.

3. The composition according to claim 2, wherein the high-boiling solvent that is miscible with water and that has a boiling point (determined at 1013 mbar) of more than 100° C. is DMSO.

4. The composition according to claim 1, wherein the composition further comprises iv) at least one surfactant.

5. The composition according to claim 1, wherein the metal on which the metal nanowires ii) are based is selected from the group consisting of silver, copper, gold and platinum.

6. The composition according to claim 1, wherein the metal nanowires ii) have an aspect ratio of at least 10:1.

7. The composition according to claim 1, wherein the composition comprises the particles of the conductive polymer i) and the metal nanowires ii) in such a relative amount that the weight ratio of metal contained in the metal nanowires:conductive polymer in the composition is in a range of from 10:1 to 1:10.

8. The composition according to claim 1, wherein the metal nanowires ii) are silver nanowires and wherein the content of silver cations in the composition is below 100 ppm, based on the total weight of the composition.

9. A process for the production of a layered body, comprising the process steps:
   I) providing a substrate;
   II) applying a composition according to claim 1 onto the substrate;
   III) partially removing at least one solvent iii) from the composition to obtain a layered body comprising an electrically conductive layer coated onto the substrate.

* * * * *